US008681117B2

(12) United States Patent
Lin et al.

(10) Patent No.: US 8,681,117 B2
(45) Date of Patent: Mar. 25, 2014

(54) FLEXIBLE SLIDE-TOUCH CONTROLLING DEVICE AND THE RELATED POSITION DETERMINATION METHOD

(75) Inventors: Heng-Ju Lin, Tainan (TW); Yu-Tang Shen, Tainan (TW); Wen-Yang Chang, Yunlin County (TW)

(73) Assignee: Industrial Technology Research Institute, Hsinchu (TW)

( * ) Notice: Subject to any disclaimer, the term of this patent is extended or adjusted under 35 U.S.C. 154(b) by 244 days.

(21) Appl. No.: 12/813,479

(22) Filed: Jun. 10, 2010

(65) Prior Publication Data
US 2011/0226536 A1 Sep. 22, 2011

(30) Foreign Application Priority Data
Mar. 22, 2010 (TW) .............................. 99108306 A (51) Int. Cl.
*G06F 3/041* (2006.01)
(52) U.S. Cl.
USPC .......................... 345/174; 178/18.01; 345/173
(58) Field of Classification Search
USPC ..................... 345/156–175; 178/18.01–18.07
See application file for complete search history.

(56) References Cited

U.S. PATENT DOCUMENTS

| 5,008,497 A * | 4/1991 | Asher ........................ 178/18.05 |
| 5,120,912 A | 6/1992 | Sharp |
| 5,403,980 A | 4/1995 | Eckrich |
| 7,535,462 B2 * | 5/2009 | Spath et al. .................... 345/174 |
| 8,159,473 B2 * | 4/2012 | Cheng et al. .................. 345/174 |
| 2005/0110767 A1 * | 5/2005 | Gomes et al. ................. 345/173 |

FOREIGN PATENT DOCUMENTS

| JP | 2003-067123 A | 3/2003 |
| TW | M289905 | 4/2006 |
| TW | 200915163 | 4/2009 |

OTHER PUBLICATIONS

Taiwan Patent Office, Office Action, Patent Application Serial No. 99108306, Aug. 23, 2013, Taiwan.

\* cited by examiner

*Primary Examiner* — Sumati Lefkowitz
*Assistant Examiner* — Joseph Fox (57) ABSTRACT

A flexible slide-touch controlling device is disclosed. The device includes first and second flexible substrates, and a spacer is interposed therebetween to form a gap between the first and second flexible substrates. A first electrode layer covers an inner surface of the first flexible substrate in the gap. A plurality of second electrode layers and a plurality of third electrode layers are respectively disposed on inner and outer surfaces of the second flexible substrate and correspond to each other. Each third electrode layer is electrically connected to a corresponding second electrode layer. A sensing material layer is disposed on the outer surface of the second flexible substrate and covers the plurality of third electrode layers to form a series of sensing segments. A position determination method for the flexible slide-touch controlling device is also disclosed.

7 Claims, 7 Drawing Sheets

FLEXIBLE SLIDE-TOUCH CONTROLLING DEVICE AND THE RELATED POSITION DETERMINATION METHOD

CROSS REFERENCE TO RELATED APPLICATIONS

This Application claims priority of Taiwan Patent Application No. 99108306, filed on Mar. 22, 2010, the entirety of which is incorporated by reference herein.

BACKGROUND OF THE INVENTION

1. Field of the Invention

The invention relates to flexible electronic devices, and more particularly, to a flexible slide-touch controlling device and the related position determination method.

2. Description of the Related Art

A human-machine interface, such as an operation panel, keyboard, switch, rocker, steering wheel, track ball, writing board, and the like, is a communication platform between humans and machines. In recent years, with the development of flexible electronic technology, various flexible human-machine interfaces have been developed. For example, a touch switch may combine touch technology with a flexible sheet material. Such a touch switch may be used instead of the conventional mechanical switch, and provide a more flexible operation interface and a various operation experience for a user.

A flexible slide-touch switch is one type of touch switch, comprising an upper metal electrode, a lower metal electrode and a sensing material layer interposed therebetween. Typically, a resistive touch switch is operated by detecting the sensing resistance difference between upper and lower metal electrodes. Since the resistive material between the metal electrodes usually age with time and due to environment factors, the precision of the resistive touch switch is reduced over time. Meanwhile, for a stack touch sensitive switch, an upper metal electrode is in direct contact with sensing material when the switch is pressed by an external force. Such a contact is non-ohmic, resulting in less than optimal sensitivity of the switch. Additionally, because the sensing material may frequently contact with the upper metal electrode, attrition may occur to reduce reliability of the switch.

Accordingly, there is a need to develop a novel touch controlling device capable of addressing the above problems.

BRIEF SUMMARY OF THE INVENTION

A detailed description is given in the following embodiments with reference to the accompanying drawings. A flexible slide-touch controlling device and position determination methods for the flexible slide-touch controlling device are provided. An embodiment of a flexible slide-touch controlling device comprises first and second flexible substrates. A spacer is interposed between the first and second flexible substrates to form a gap therebetween. A first electrode layer covers an inner surface of the first flexible substrate in the gap. A plurality of second electrode layers is disposed on an inner surface of the second flexible substrate in the gap. A plurality of third electrode layers is disposed on an outer surface of the second flexible substrate and corresponds to the plurality of second electrode layers. Each third electrode layer is electrically connected to a corresponding second electrode layer. A sensing material layer is disposed on the outer surface of the second flexible substrate and covers the plurality of third electrode layers to form a series of sensing segments.

An embodiment of a position determination method for a flexible slide-touch controlling device comprises providing a flexible slide-touch controlling device comprising first and second flexible substrates. A spacer is interposed between the first and second flexible substrates to form a gap therebetween. A first electrode layer covers an inner surface of the first flexible substrate in the gap. A plurality of second electrode layers is disposed on an inner surface of the second flexible substrate in the gap. A plurality of third electrode layers is disposed on an outer surface of the second flexible substrate and corresponds to the plurality of second electrode layers. Each third electrode layer is electrically connected to a corresponding second electrode layer. A sensing material layer is disposed on the outer surface of the second flexible substrate and covers the plurality of third electrode layers to form a series of sensing segments corresponding to the plurality of third electrode layers. A first end of the series of sensing segments is coupled to a ground and a second end of the series of sensing segments is coupled to a voltage source. The first flexible electrode layer is pressed, such that the first electrode layer electrically contacts with a corresponding sensing segment through one of the plurality of third electrode layers. A voltage across the first end of the series of sensing segments and the sensing segment which is electrically contacted to the first electrode layer is obtained. A contact position corresponding to the sensing segment which electrically contacts with the first electrode layer in the flexible slide-touch controlling device is determined according to a ratio of the voltage and the voltage source.

Another embodiment of a position determination method for a flexible slide-touch controlling device comprises providing a flexible slide-touch controlling device comprising first and second flexible substrates. A spacer is interposed between the first and second flexible substrates to form a gap therebetween. A first electrode layer covers an inner surface of the first flexible substrate in the gap. A plurality of second electrode layers is disposed on an inner surface of the second flexible substrate in the gap. A plurality of third electrode layers is disposed on an outer surface of the second flexible substrate and corresponds to the plurality of second electrode layers. Each third electrode layer is electrically connected to a corresponding second electrode layer. A sensing material layer is disposed on the outer surface of the second flexible substrate and covers the plurality of third electrode layers to form a series of sensing segments corresponding to the plurality of third electrode layers. A first end of the series of sensing segments is coupled to a ground through a reference resistor. A second end of the series of sensing segments is coupled to a voltage source to obtain a first voltage from the first end. The voltage source is removed from the second end of the series of sensing segments. The first electrode layer is coupled to the voltage source and the first flexible electrode layer is pressed, such that the first electrode layer electrically contacts with a corresponding sensing segment through one of the plurality of third electrode layers, to obtain a second voltage from the first end. A contact position corresponding to the sensing segment which electrically contacts with the first electrode layer in the flexible slide-touch controlling device is determined according to the first voltage, the second voltage and the voltage source.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is of the best-contemplated mode of carrying out the invention. This description is provided for the purpose of illustrating the general principles of the invention and should not be taken in a limiting sense. The scope of the invention is best determined by reference to the appended claims.

Figure 1A:
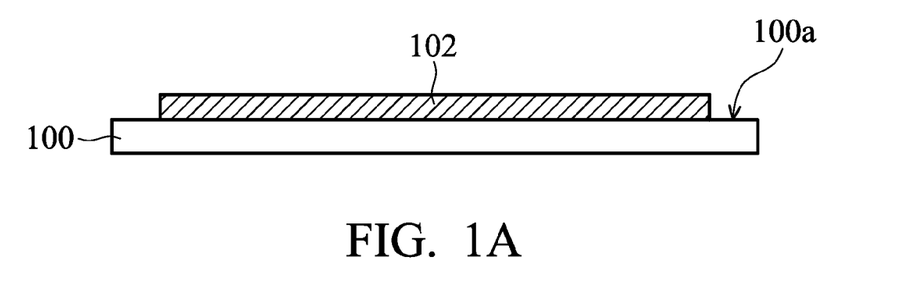
FIGS. 1A to 1E are cross sections of an exemplary embodiment of a method for fabricating a flexible slide-touch controlling device 300 according to the invention.
Figure 1B:
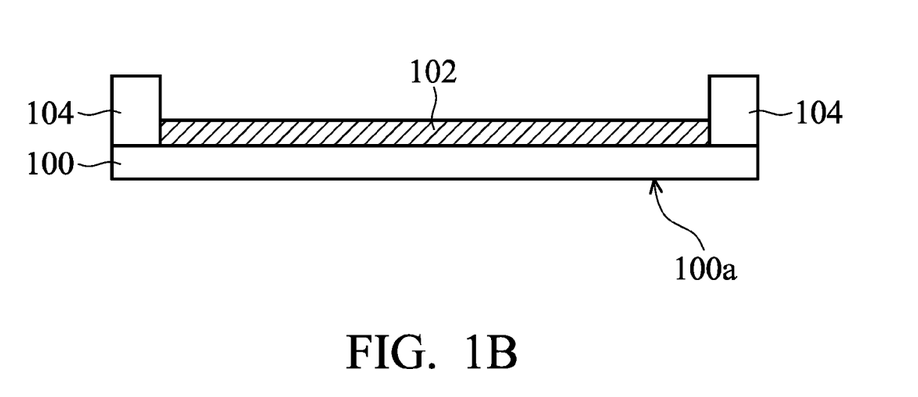
Figure 1C:
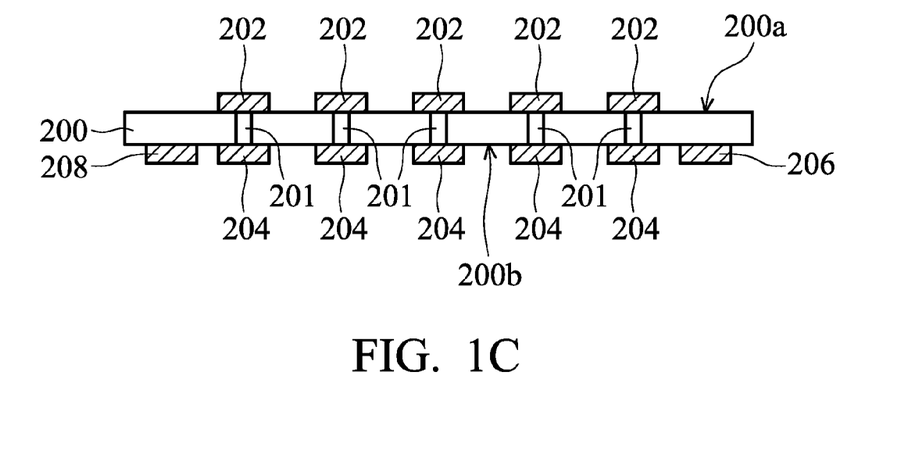
Figure 1D:
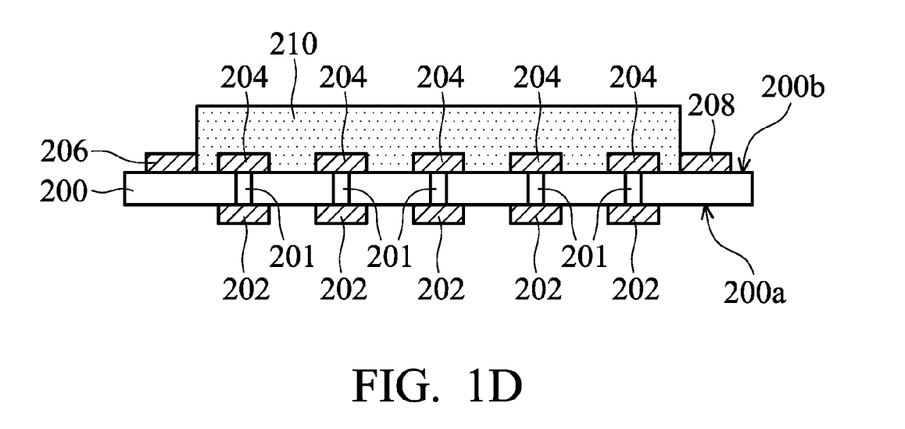
Figure 1E:
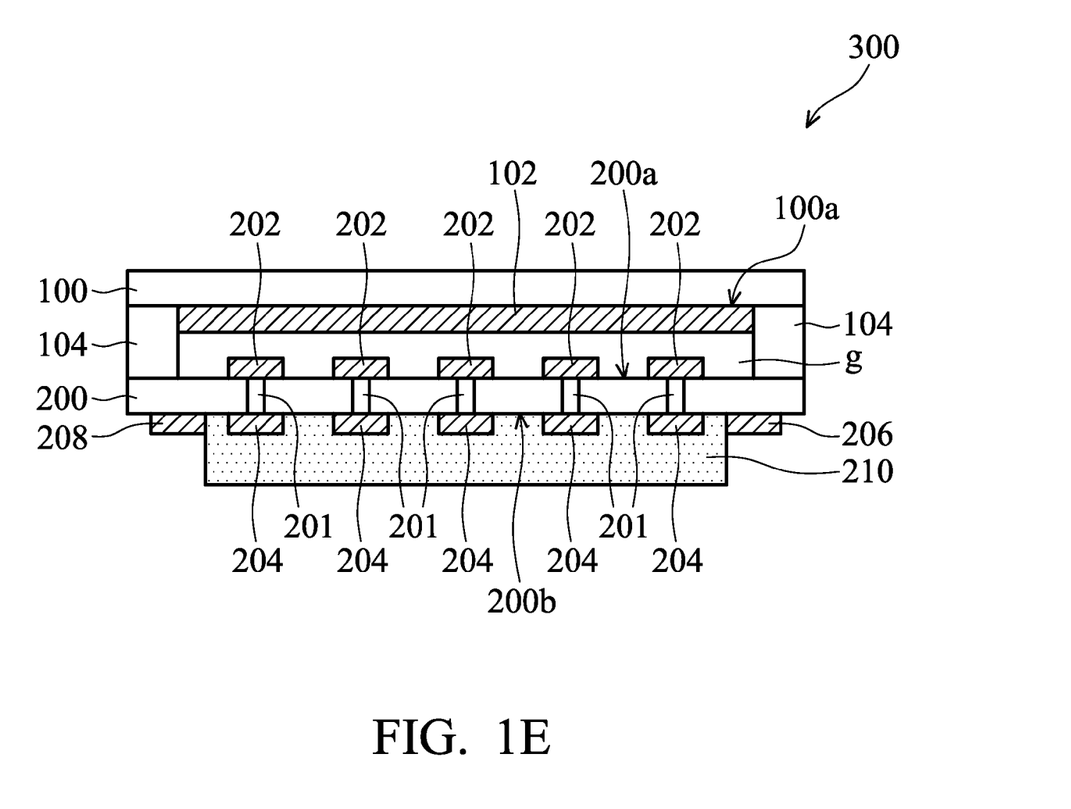

Referring to FIG. 1E, which illustrates a cross section of an exemplary embodiment of a flexible slide-touch controlling device 300 according to the invention. The flexible slide-touch controlling device 300, such as a flexible touch switch, comprises a first flexible substrate 100 and a second flexible substrate 200 opposite thereto. In the embodiment, the first flexible substrate 100 is disposed above the second flexible substrate 200. Moreover, a spacer 104 is interposed between the first flexible substrate 100 and the second flexible substrate 200 to form a gap g therebetween.

A first electrode layer 102 covers a surface 100a of the first flexible substrate 100 in the gap g to form a continuous electrode region. A plurality of second electrode layers 202 is disposed on a surface 200a of the second flexible substrate 200 in the gap g to form a non-continuous electrode region. The first electrode layer 102 is spaced from the plurality of second electrode layers 202 by the gap g. The plurality of second electrode layers 202 serves as multiple contact points for the switch, such that the flexible slide-touch controlling device 300 may perform multi-level regulation though the multiple contact points. In one embodiment, the plurality of second electrode layers 202 may be arranged in a linear shape for slide-touch operation by the user. In some embodiments, the plurality of second electrode layers 202 may be arranged in an arc, circular, or waved shape.

A plurality of third electrode layers 204 is disposed on a surface 200b and corresponds to the non-continuous electrode region (i.e., the plurality of second electrode layers 202). Each third electrode layer 204 is electrically connected to a corresponding second electrode layer 202. Additionally, a fourth electrode layer 206 and a fifth electrode layer 208 are disposed on the surface 200b of the second flexible substrate 200 and outside of the non-continuous electrode region.

In the embodiment, the second flexible substrate 200 has a plurality of through substrate vias (TSVs) 201 that is substantially aligned to the plurality of second electrode layers 202 and the plurality of third electrode layers 204. Each TSV 201 is constituted of a through hole and a conductive material (not shown) therein, so as to electrically connect between each second electrode layer 202 and the corresponding third electrode layer 204. Note that the fourth electrode layer 206 and the fifth electrode layer 208 are electrically connected to the second electrode layers 202 without passing through any TSV 201.

A sensing material layer 210, made of material such as a resistive or piezoelectric material, has multi-leveled properties (e.g., the material property, such as resistance, has a corresponding relationship with pressure) and is disposed on the surface 200b of the second flexible substrate 200 to correspond to the non-continuous electrode region and cover the plurality of third electrode layers 204, thereby forming a series of sensing segments corresponding to the plurality of third electrode layers 204. The fourth and fifth electrode layers 206 and 208 uncovered by the sensing material 210 are coupled to both ends of the sensing material layer 210 (i.e., both ends of the series of sensing segments).

FIGS. 1A to 1E are cross sections of an exemplary embodiment of a method for fabricating a flexible slide-touch controlling device 300 according to the invention. Referring to FIG. 1A, a first flexible substrate 100 is provided. The first flexible substrate 100 has a surface 100a that has a continuous electrode region formed of a first electrode layer 102. In the embodiment, the first flexible substrate 100 and the first electrode layer 102 may be formed of, for example, a printed board. A spacer 104 is formed on the surface 100a of the first flexible substrate 100 outside of the continuous electrode region and protrudes from the surface of the first electrode layer 102, as shown in FIG. 1B. In one embodiment, the spacer 104 has an isolation function, such that upper and lower layers are insulated from each other.

Referring to FIG. 1C, a second flexible substrate 200 is provided. The second flexible substrate 200 has a surface 200a having a non-continuous electrode region formed of a plurality of second electrode layers 202 thereon and has a surface 200b having a plurality of third electrode layers 204 thereon and corresponding to the non-continuous electrode region and having fourth and fifth electrodes 206 and 208 outside of the non-continuous electrode region. The plurality of second electrode layers 202 may be arranged in a linear, arc, circular, or waved shape. Moreover, the second flexible substrate 200 has a plurality of TSVs 201, wherein each TSV 201 corresponds to one second electrode layer 202 and one third electrode layer 204 for electrical connection therebetween. In the embodiment, the second flexible substrate 200, the plurality of second electrode layers 202, the third electrode layers 204, the fourth electrode layer, and the fifth electrode layer 208 may also be formed of a printed board.

Referring to FIG. 1D, a sensing material layer 210 is formed on the surface 200b of the second flexible substrate 200 by printing. In some embodiments, the sensing material layer 210 may be formed by sputtering or evaporation. In the embodiment, the sensing material layer 210 corresponds to a non-continuous electrode region and covers the plurality of third electrode layers 204 to form a series of sensing segments corresponding to the plurality of third electrode layers 204. In one embodiment, the fourth and fifth electrode layers 206 and 208 on the surface 200b of the second flexible substrate 200 and outside of the non-continuous electrode region are coupled to both ends of the sensing material layer 210 (i.e., both ends of the series of sensing segments), respectively.

Referring to FIG. 1E, the spacer 104 on the first flexible substrate 100 is adhered onto the surface 200a of the second flexible substrate 200, thereby forming a gap g between the first and second flexible substrates 100 and 200 to complete the flexible slide-touch controlling device 300 of the embodiment.

According to the aforementioned embodiment, when the flexible slide-touch controlling device 300 is pressed by an external force, the first electrode layer 102 is in direct contact with the second electrode layer 202 to form an ohmic contact therebetween. Compared to conventional resistive touch switch, the sensitivity of the flexible slide-touch controlling device 300 is increased. Moreover, since the flexible slide-touch controlling device 300 employs the second electrode layer 202 to contact with the first electrode layer 102, attrition of the sensing material layer 210 is prevented, thereby increasing reliability of the flexible slide-touch controlling device 300. Additionally, the plurality of second electrode layers 202 forms multiple contact points, such that the flexible slide-touch controlling device 300 is capable of performing multi-level regulation by precisely determining the contact position in the device 300.

Figure 2:
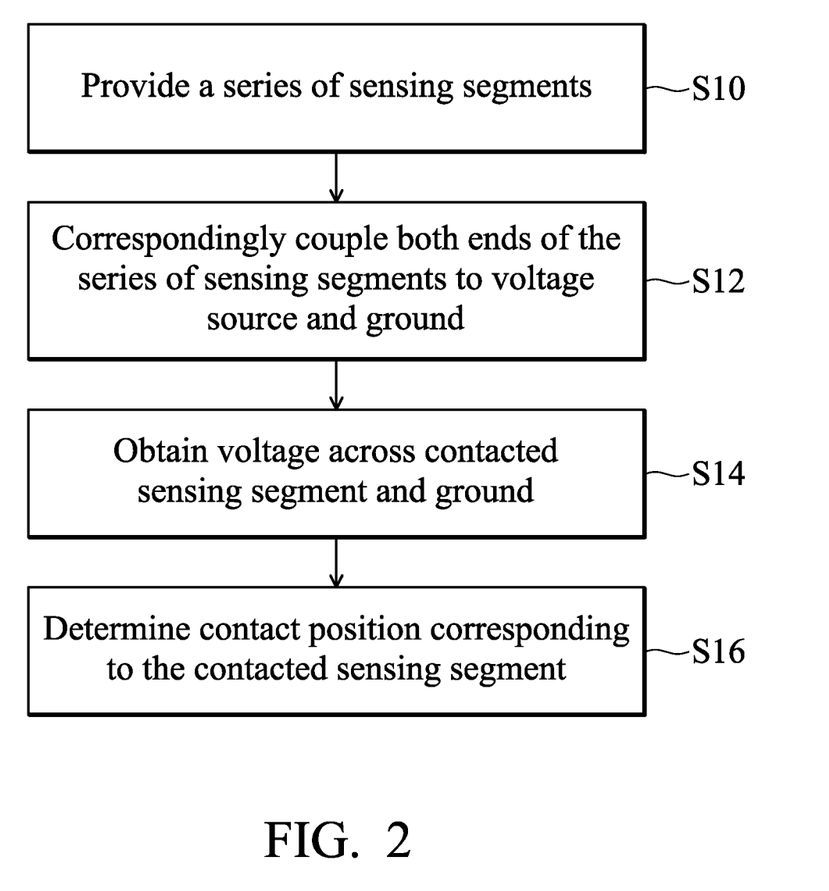
FIG. 2 is a flowchart of an exemplary embodiment of a position determination method for a flexible slide-touch controlling device according to the invention.
Figure 3:
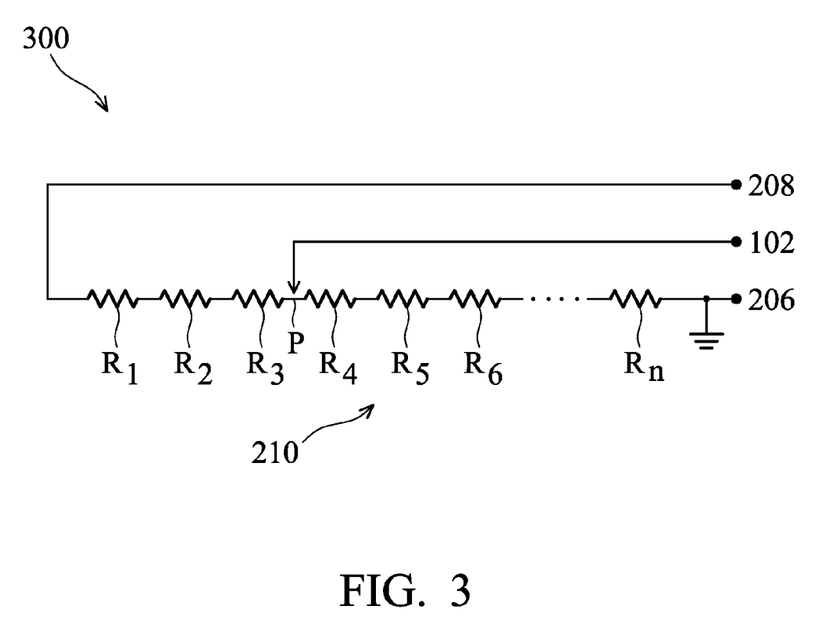
FIG. 3 is an equivalent circuit diagram of the flexible slide-touch controlling device 300 shown in FIG. 1E.

Referring to FIGS. 2 and 3, in which FIG. 2 is a flowchart of an exemplary embodiment of a position determination method for a flexible slide-touch controlling device according to the invention and FIG. 3 is an equivalent circuit diagram of the flexible slide-touch controlling device 300 shown in FIG. 1E, in step S10, a flexible slide-touch controlling device 300 having a series of sensing segments formed of the sensing material layer 210 is provided. The series of sensing segments formed of the sensing material layer 210 comprise a plurality of sensing segments $R_1$, $R_2$, $R_3$, $R_4$, $R_5$, $R_6$ to $R_n$ (as shown in FIG. 3) corresponding to the plurality of third electrode layer 204 (as shown in FIG. 1E).

In step S12, a first end of the series of sensing segments is coupled to the fourth electrode layer 206 that is coupled to a ground, and a second end of the series of sensing segments is coupled to the fifth electrode layer 208 that is coupled to a voltage source Vcc.

In step S14, the first flexible substrate 100 shown in FIG. 1E is pressed, such that the first electrode layer 102 electrically contacts one of the plurality of second electrode layers 202 and then the first electrode layer 102 electrically contacts a sensing segment through the corresponding third electrode layer 204. For example, the first electrode layer 102 electrically contacts the second electrode layer 202 corresponding to the sensing segment $R_4$ (as shown in FIG. 3). Thereafter, a voltage Vout across the sensing segment $R_4$, electrically contacts the first electrode layer 102, and the first electrode layer 206 (i.e., the first end of the series of sensing segments).

In step S16, a contact position P corresponding to the contacted sensing segment (e.g., the sensing segment $R_4$) in the flexible slide-touch controlling device 300 is determined. In the embodiment, the contact position P can be expressed as $(R_4+R_5+R_6+\ldots+R_n)/R_T$, where $R_T$ is the total resistance of the series of sensing segments (i.e., $R_T=R_1+R_2+R_3+R_4+R_5+R_6+\ldots+R_n$). It can be observed in the equivalent circuit diagram shown in FIG. 3 that the ratio of the voltage Vout and the voltage source Vcc (i.e., Vout/Vcc) can be expressed as $(R_4+R_5+R_6+\ldots+R_n)/R_T$. Accordingly, the contact position P can be determined according to the ratio of the voltage Vout and the voltage source Vcc (i.e., Vout/Vcc).

According to the aforementioned embodiment, when the sensing material layer 210 ages, the ratio of the voltage Vout and the voltage source Vcc is expressed as $(R_4+R_5+R_6+\ldots+R_n)\times A(t)/(R_T\times A(t))$, where A(t) is an aging factor. This ratio (i.e., $(R_4+R_5+R_6+\ldots+R_n)/R_T$) is equal to that of the sensing material layer 210 without aging. Namely, the ratio of the voltage Vout and the voltage source Vcc is not varied while the sensing material layer 210 ages. Accordingly, as the flexible slide-touch controlling device 300 is operated by the user, the contact position P in the flexible slide-touch controlling device 300 can be precisely determined according to the ratio of the voltage Vout and the voltage source Vcc.

Figure 4:
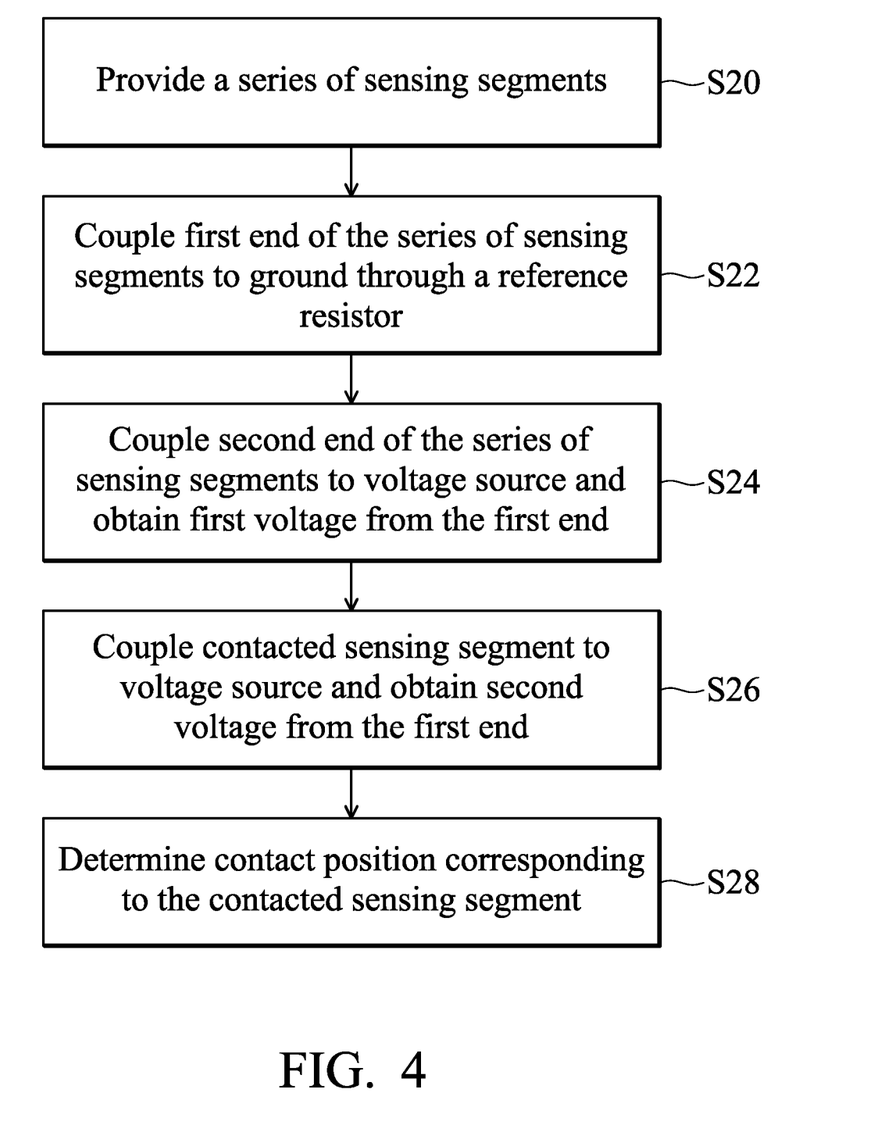
FIG. 4 is a flowchart of another exemplary embodiment of a position determination method for a flexible slide-touch controlling device according to the invention.
Figure 5:
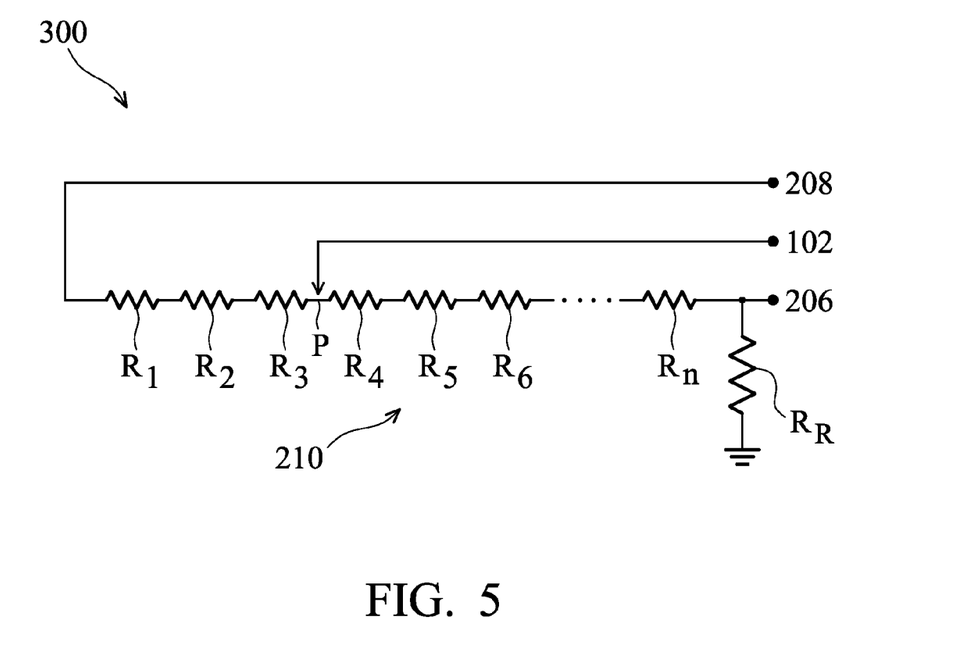
FIG. 5 is an equivalent circuit diagram of the flexible slide-touch controlling device 300 shown in FIG. 1E.

Referring to FIGS. 4 and 5, in which FIG. 4 is a flowchart of another exemplary embodiment of a position determination method for a flexible slide-touch controlling device according to the invention and FIG. 4 is an equivalent circuit diagram of the flexible slide-touch controlling device 300 shown in FIG. 1E, in step S20, a flexible slide-touch controlling device 300 having a series of sensing segments formed of the sensing material layer 210 is provided. The series of sensing segments formed of the sensing material layer 210 comprise a plurality of sensing segments $R_1$, $R_2$, $R_3$, $R_4$, $R_5$, $R_6$ to $R_n$ (as shown in FIG. 5) corresponding to the plurality of third electrode layer 204 (as shown in FIG. 1E).

In step S22, a first end of the series of sensing segments is coupled to the fourth electrode layer 206 that is coupled to a ground through a reference resistor $R_R$.

In step S24, a second end of the series of sensing segments is coupled to the fifth electrode layer 208 that is coupled to a voltage source Vcc. Thereafter, a first voltage V1 from the first end of the series of sensing segments (i.e., the voltage across the reference resistor $R_R$) is obtained.

In step S26, the voltage source Vcc is removed from the second end of the series of sensing segments. Next, the first electrode layer 102 is coupled to the voltage source Vcc and then the first flexible substrate 100 shown in FIG. 1E is pressed, such that the first electrode layer 102 electrically contacts one of the plurality of second electrode layers 202 and then the first electrode layer 102 electrically contacts a sensing segment through the corresponding third electrode layer 204. For example, the first electrode layer 102 electrically contacts the second electrode layer 202 corresponding to the sensing segment $R_4$ (as shown in FIG. 5). Thereafter, a second voltage V2 from the first end of the series of sensing segments (i.e., the voltage across the reference resistor $R_R$) is obtained.

In step S28, a contact position P corresponding to the contacted sensing segment (e.g., the sensing segment $R_4$) in the flexible slide-touch controlling device 300 is determined. In the embodiment, the contact position P can be expressed as $(R_4+R_5+R_6+\ldots+R_n)/R_T$. It can be observed in the equivalent circuit diagram shown in FIG. 5 that the total resistance $R_T$ can be expressed as $(Vcc-V1)\times R_R/V1$. Moreover, the resistance of the sensing segment $R_4$ to the first end of the series of sensing segments (i.e., $R_4+R_5+R_6+\ldots+R_n$) can be expressed as $(Vcc-V2)\times R_R/V2$. Accordingly, the contact position P can be further expressed as $V1(Vcc-V2)/V2(Vcc-V1)$. Namely, the contact position P can be determined according to the first voltage V1, the second voltage V2, and the voltage source Vcc.

According to the aforementioned embodiment, when the sensing material layer 210 ages, the contact position P can be expressed as $(R_4+R_5+R_6+\ldots+R_n)\times A(t)/(R_T\times A(t))$. Namely, when the sensing material layer 210 ages, the contact position P can also be expressed as $V1(Vcc-V2)/V2(Vcc-V1)$. The flexible slide-touch controlling device 300 is operated by the user, so that the contact position P in the flexible slide-touch controlling device 300 can be precisely determined according to the first voltage V1, the second voltage V2, and the voltage source Vcc.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A flexible slide-touch controlling device, comprising:
a first flexible substrate and a second flexible substrate;
a spacer, interposed between the first and second flexible substrates to form a gap therebetween;

a first electrode layer, covering an inner surface of the first flexible substrate in the gap;

a plurality of second electrode layers, disposed on an inner surface of the second flexible substrate in the gap;

a plurality of third electrode layers, disposed on an outer surface of the second flexible substrate opposite to the inner surface thereof and corresponding to the plurality of second electrode layers, wherein each third electrode layer is electrically connected to a corresponding second electrode layer; and a sensing material layer covering the plurality of third electrode layers on the outer surface of the second flexible substrate to form a series of sensing segments, wherein the plurality of third electrode layers and the sensing material layer are separated from the plurality of second electrode layers by the second flexible substrate.

2. The device of claim 1, further comprising a fourth electrode layer and a fifth electrode layer correspondingly coupled to two ends of the series of sensing segments.

3. The device of claim 2, wherein the fourth and fifth electrode layers are disposed on the outer surface of the second flexible substrate and not covered by the sensing material layer.

4. The device of claim 1, wherein the second flexible substrate has a plurality of through substrate vias therein to electrically connect each second electrode layer with a corresponding third electrode layer.

5. The device of claim 1, wherein the plurality of second electrode layers is arranged in a linear, arc, circular, or waved shape.

6. A position determination method for a flexible slide-touch controlling device, comprising:

providing a flexible slide-touch controlling device, comprising:

a first flexible substrate and a second flexible substrate;

a spacer, interposed between the first and second flexible substrates to form a gap therebetween;

a first electrode layer, covering an inner surface of the first flexible substrate in the gap;

a plurality of second electrode layers, disposed on an inner surface of the second flexible substrate in the gap;

a plurality of third electrode layers, disposed on an outer surface of the second flexible substrate and corresponding to the plurality of second electrode layers, wherein each third electrode layer is electrically connected to a corresponding second electrode layer; and a sensing material layer disposed on the outer surface of the second flexible substrate and covering the plurality of third electrode layers to form a series of sensing segments corresponding to the plurality of third electrode layers;

coupling a first end of the series of sensing segments to a ground and coupling a second end of a series of sensing segments to a voltage source;

pressing the first flexible electrode layer, such that the first electrode layer electrically contacts with a corresponding sensing segment through one of the plurality of third electrode layers;

obtaining a voltage across the first end of the series of sensing segments and the sensing segment which electrically contacts with the first electrode layer; and determining a contact position corresponding to the sensing segment which electrically contacts with the first electrode layer in the flexible slide-touch controlling device according to a ratio of the voltage and the voltage source.

7. The method of claim 6, wherein the flexible slide-touch controlling device further comprises a fourth electrode layer and a fifth electrode layer correspondingly coupled to two ends of the series of sensing segments.

* * * * *